United States Patent [19]

Hurowitz

[11] Patent Number: 5,211,496

[45] Date of Patent: May 18, 1993

[54] DOUBLE WEDGELOCK CLAMP

[75] Inventor: Mark Hurowitz, San Carlos, Calif.

[73] Assignee: Kaiser Aerospace and Electronics Corporation, San Jose, Calif.

[21] Appl. No.: 830,533

[22] Filed: Jan. 30, 1992

Related U.S. Application Data

[63] Continuation of Ser. No. 558,904, Jul. 27, 1990, abandoned.

[51] Int. Cl.[5] ............................................. F16B 1/00
[52] U.S. Cl. ........................ 403/24; 361/386; 361/399; 361/415; 403/374; 403/409.1
[58] Field of Search ............... 361/380, 386-389, 361/395, 399, 415; 254/104; 403/24, 25, 374, 409.1

[56] References Cited

U.S. PATENT DOCUMENTS

| | | |
|---|---|---|
| 1,662,715 | 3/1928 | Morrow . |
| 2,039,058 | 4/1936 | Cooke . |
| 2,584,410 | 2/1952 | Abney . |
| 2,825,571 | 3/1958 | McIntosh . |
| 4,004,855 | 1/1977 | Stecklein . |
| 4,277,196 | 7/1981 | Morel . |
| 4,298,904 | 11/1981 | Koening ........................... 361/386 |
| 4,318,157 | 3/1982 | Rank et al. ...................... 361/388 |
| 4,354,770 | 10/1982 | Block . |
| 4,744,692 | 5/1988 | Olsen et al. . |
| 4,979,073 | 12/1990 | Husted ............................. 361/386 |

Primary Examiner—Gregory D. Thompson
Attorney, Agent, or Firm—Townsend and Townsend Khourie and Crew

[57] ABSTRACT

A clamp assembly includes a pair of segmented leg members that are tandem-operated to capture and hold a circuit board or module in and to chassis slots. The leg members each comprise a plurality of distinct wedge segment having complementary, confronting wedge surfaces.

16 Claims, 2 Drawing Sheets

U.S. Patent   May 18, 1993   5,211,496
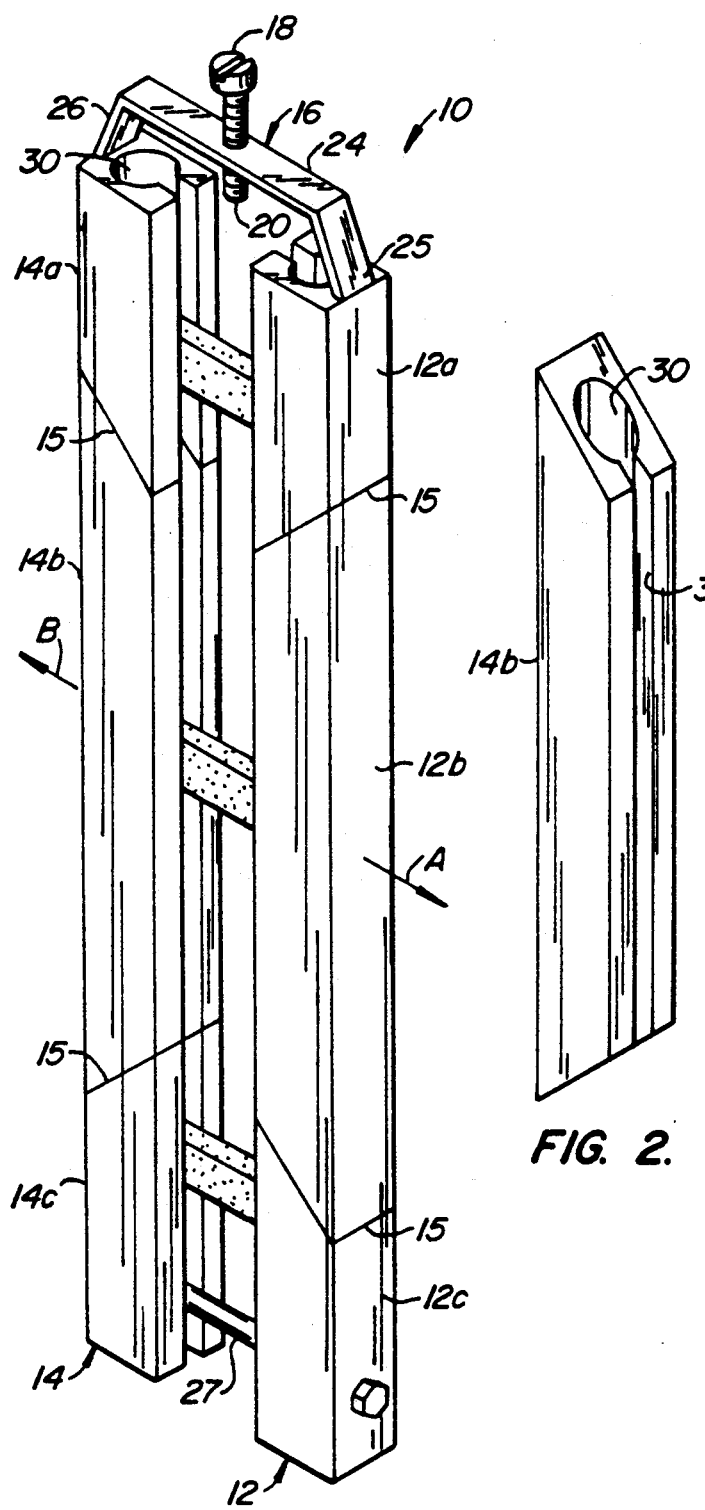
FIG. 1.
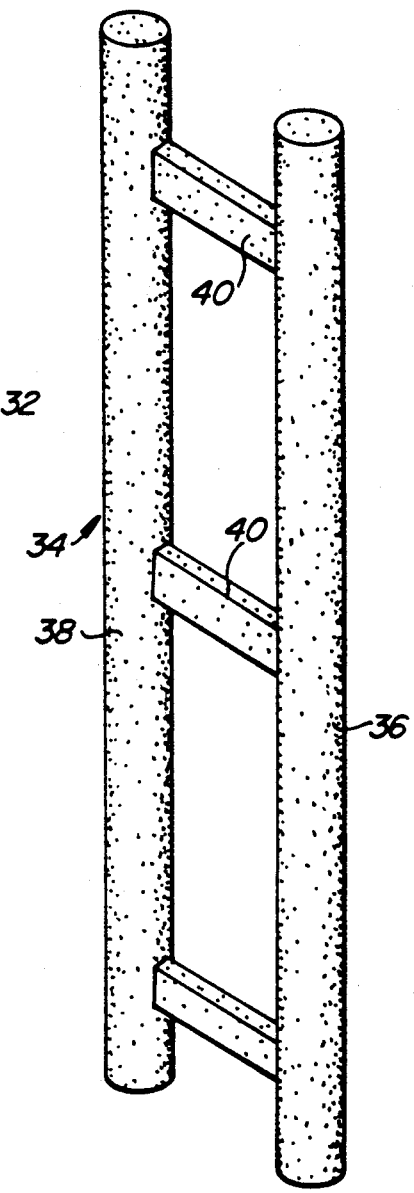
FIG. 2.
FIG. 3.

DOUBLE WEDGELOCK CLAMP

This is a continuation of application Ser. No. 07/558,904 filed Jul. 27, 1990, now abandoned.

BACKGROUND OF THE INVENTION

The present invention relates to an assembly for fastening a circuit card assembly or a module, in place within slots formed in a chassis cold wall. In addition to maintaining the circuit card assembly or module in place, the assembly forms a thermal conductive path to the chassis.

Electronic systems often have their electronic components mounted on circuit boards that are placed in the system by inserting an end connector on the board into a complementary connector socket—usually soldered on an underlying motherboard. Typically, a number of such circuit boards would be positioned in parallel spaced relation to one another.

The lateral edges of the circuit boards are fitted and held in slots formed in a chassis to maintain the circuit boards rigidly in place and, perhaps more importantly, to provide a thermal conductive path from the circuit board to the chassis, allowing the chassis to serve as a heat sink. For this latter purpose, heat sink strips are located at lateral edges of the board. For good thermal conductivity, it is important that the circuit boards be in good thermal contact with the chassis.

Among the techniques to hold the circuit board edges in place in slots formed in the chassis is the use of wedge-clamps. These devices operate to establish and maintain the board-chassis contact and to provide the necessary transfer of heat from the board to the chassis body. An example of such a clamp is shown in U.S. Pat. No. 4,354,770. The wedge-clamp forces edges of the circuit board against one surface of the chassis slot.

Such wedge-clamps are typically located between one edge of the circuit board and a wall of a slot formed in the chassis. Tightening the wedge-clamp forces the board to reference to the chassis slot rather than the (usually underlying) motherboard to which it may be connected. Often, the slots and motherboard connection are not accurately aligned, relative to one another. When misaligned, the board will bend and the connector is stressed, creating a point of possible failure. This becomes a particular problem for circuit boards using metal core surface mount assemblies which are especially susceptible to failure if bent. Thus, to secure the edges of a metal core surface mount assembly requires precise chassis tolerances to locate the slots relative to the underlining motherboard connector to reduce or eliminate bending. This is expensive in terms of both labor and material.

The problem exacerbates when circuits are packaged in module form. Typically such modules have a cube-like housing, containing electronics circuitry mounted on multiple circuit boards. The module also has one or more connectors on one surface for electrical connection to a motherboard or back plane. As with the circuit board, the module includes tabs, usually formed on opposing sides of the module, two or more tabs per side, to fit into the slots in the chassis. As with the circuit card assembly described above, the tab-slot mating surfaces provides both heat transfer paths and placement rigidity to the module. However, the tab-slot alignment for locking the tabs in place with conventional wedge-clamps requires that the module housing and the chassis slots be formed with relatively precise tolerances to obtain a proper fit and locking action. Again, as with circuit boards, this increases the cost (in terms of time, labor and expense) of manufacture of such packaging.

SUMMARY OF THE INVENTION

The present invention relates to a dual wedgelock, clamp assembly for securing an edge of a circuit board, or a module tab, in a slot of a chassis. The assembly utilizes a pair of parallel-operated wedge-clamps attached to each edge, operating to center and secure the edge/tab in place without bending or flexing.

The assembly includes a pair of segmented leg members, each forming a wedge-clamp. Each leg member comprises a plurality of distinct wedge segments having complementary wedge surfaces coupled together at their upper edges by a yoke through which a threaded activating screw extends. The bottom wedge segments are fixed in position and attached to the circuit card assembly or module. The assembly is adapted to fit into a slot formed in a chassis with each leg member being located on opposite sides of the edge or tab of a circuit board. Rotation of the threaded activating screw effects movement of the yoke, which, in turn, will impose a longitudinal force on the wedge segments of both leg members, causing lateral movement of the segments into engagement with the circuit board edge and the walls of the slot. The rotating activating screw simultaneously actuates the two leg members.

In the preferred embodiment, an elastomeric member extends longitudinally in a keyway formed within the wedge segments, thereby holding the wedge segments in place prior to fastening. Crossover members join the leg members of the opposite wedge segments and return the clamps to their minimum width position upon loosening of the activating screw.

The dual wedgelock clamp assembly of the present invention provides a means for securing the edges of a circuit board in a slot without flexure of the circuit board. Independent movement of the wedge segments compensates for unequal gaps on respective sides of the circuit board edges by permitting unequal movement of the yoke.

Other features and advantages will appear from the following description in which the preferred embodiment has been set forth in detail in conjunction with the accompanying drawings.

BRIEF DESCRIPTION OF THE DRAWINGS

FIG. 1 is an isometric view of a simplified version of the wedgelock clamp assembly of the present invention;

FIG. 2 is an isometric view of one of the wedge segments of a leg of the wedgelock clamp assembly illustrated in FIG. 1;

FIG. 3 is an illustration of the elastomeric ladder element used to hold the wedge segments of the invention shown in FIG. 1 together;

DESCRIPTION OF THE PREFERRED EMBODIMENT

Figure 4:
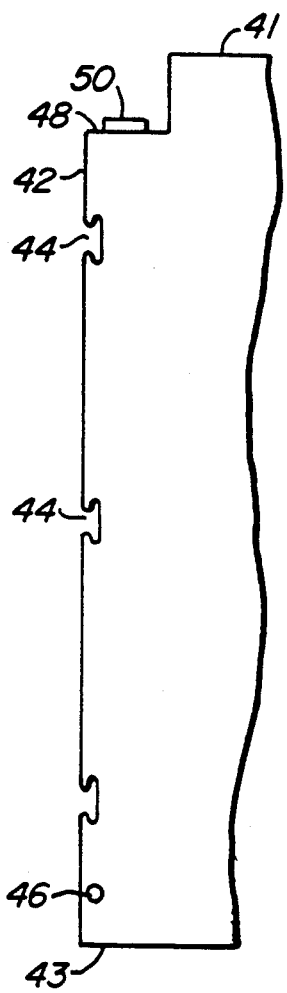
FIG. 4 is an illustration of the tab or edge portion of a circuit board, configured to receive the wedgelock clamp assembly of FIG. 1.

Turning now to the Figures, FIGS. 1-3 illustrate, in simplified form, a construction of the dual wedgelock clamp assembly of the present invention. As FIG. 1 shows, the dual wedgelock clamp assembly, designated generally with the reference numeral 10, includes a pair of segmented leg members 12 and 14. The segmented leg members 12 and 14 each respectively comprise upper and lower segments 12a/14a and 12c/14c separated by an inner segment 12b/14b. The segments of each leg member 12, 14 are generally linearly arranged, and the inner segments 12b, 14b confronts its neighbors via complementary-angled wedge surfaces 15.

Loosely attached to the top segments 12a, 14a is a yoke 16 that spans from one to the other. Through approximately the middle of the yoke 16 is a threaded activating screw 18. The terminus 20 of the activating screw 18 threads into the tab or edge of a circuit board assembly or module to activate the yoke as will be described more fully below. The terminal portions couple to the leg members 12 and 14.

Formed longitudinally through each of the segmented leg members 12, 14, as more particularly illustrated in FIG. 2 (showing the inner segment 14b of leg 14; insofar as the other leg segments are concerned, this discussion of the inner segment 14b applies to them equally), is a keyway 30. A channel 32 extends the length of the segment and opens into the keyway 30. The keyway 30 receives the legs 36, 38 of an elastomeric ladder element 34 (FIGS. 1 and 3) that operates to hold the segments of the leg members 12, 14 together, yet permits some lateral movement of the segments. As FIG. 3 further illustrates, the ladder element 34 includes cross-over elements 40 that attach and hold the legs 36, 38 together. The channel 32, opening from the keyway 30, permits the crossover elements 40 to extend from each of the segments of the leg members 12, 14.

Returning to FIG. 1, note that a pin 27 is affixed to and extends between the lower segments 12c, 14c, of the leg members 12, 14. Pin 27, as will be seen, holds the bottom segment 12c, 14c in fixed relation to the circuit card assembly or module.

Preferably, the individual segments of the leg member 12, 14 are fabricated from extruded aluminum, or other heat-conductive metal. The elastomeric ladder element 34 is preferably fabricated from a fluorosilicon (a silicon rubber-based material) that is tear-resistant and heat-resistant.

Preferably, the tab or edge with which the wedgelock clamp assembly 10 is to be used is especially configured for such use. Illustrated in FIG. 4 is a side portion of a circuit board 41 with an edge tab 42. Although not specifically shown, the circuit board 41 would include, for example, at the bottom periphery 43, a circuit connector (not shown). At the other end (from the tab 42 shown in FIG. 4) of the circuit board 41 is a tab configured in the same manner as tab 42.

As FIG. 4 illustrates, the tab 42 is provided with cut-outs 44 to permit the cross-over elements 40 of the elastomeric ladder element 34 (FIG. 3) to extend therethrough. In addition, the tab 42 has an aperture 46 through which will extend pin 27. Finally, the tab 42 has formed at 48 a threaded section 49 configured to receive the terminus 20 (FIG. 1) of the activating screw 18.

In use, the wedgelock clamp 10 is mounted to the edge tab 42 of circuit board 41 so that the leg members 12, 14 are on either side of the tab 42 with the cross-over members 40 of the elastomeric ladder element extending through the cut-outs 44. Pin 27 extends from and between the bottom segments 12c, 14c through the aperture 46, operating to hold the bottom segments 12c, 14c fixed relative to the tab edge 42.

Figure 5:
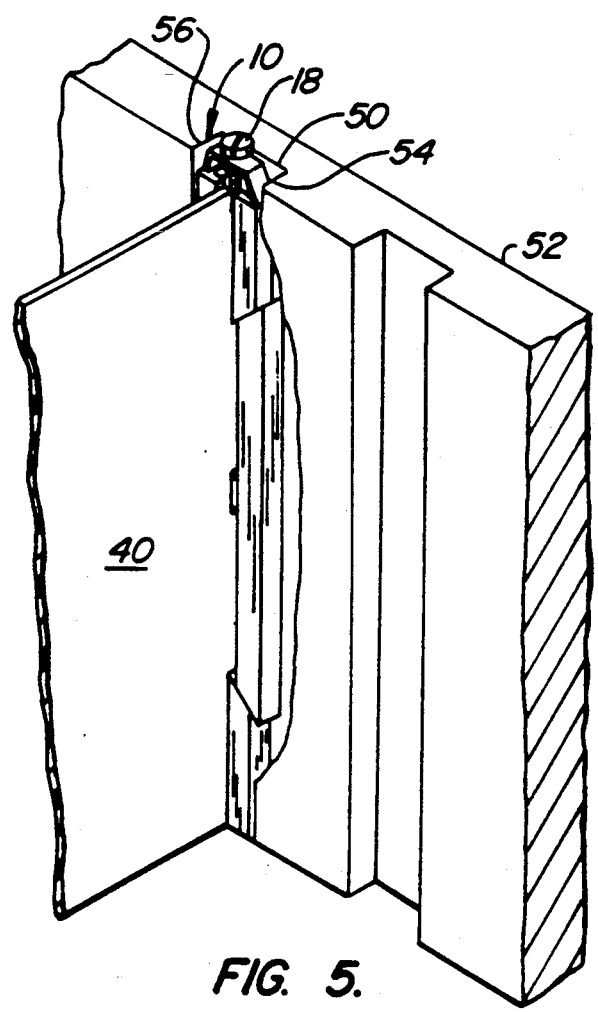
FIGS. 5 and 6 are illustrations of use of the wedgelock clamp assembly of FIG. 1, affixing the tab of a circuit board, and the tabs of a circuit assembly module, respectively, to a chassis.

The edged tab 42 with the wedgelock clamp assembly 10 so attached is inserted in place as illustrated in FIG. 5 so that the combination (tab 42 and assembly 10) is situated in a channel 50 formed in a chassis sidewall 52. It will be appreciated that, although not specifically illustrated in FIG. 5, the board 41 extends from one channel so formed in the chassis side wall 52 to an opposing channel similarly formed in a confronting chassis sidewall (not shown), and has a similar, tab formed at the opposite end thereof that also fits in the opposing channel (not shown) to be held in place by another wedgelock clamp assembly of the present invention.

Returning to FIG. 5, with the circuit board tab 42 and wedgelock clamp assembly 10 so in place, the threaded activating screw 18 is rotated in a direction (depending upon the threads) that cause the yoke 16 to exert a downward force on the upper segments 12a, 14a' of the leg members 12, 14. In turn, the upper segments 12a, 14a exert a force on the inner and lower segments. However, since the lower segments 12c, 14c are held immobile by the pin 27, the exerted force will, by reason of the complementary-angled wedge surfaces, force the inner segments 12b, 14b outward as indicated by the arrows A and B, respectively (FIG. 1), and into wedging engagement with the side surfaces 54, 56 of the channel 50, as diagrammatically illustrated in FIG. 5. Similar activity is conducted at the other end (not shown) of the circuit board 41. Thereby, the tabs 42 of a circuit board 41 are positioned, and affixed (wedged) in channels 50 of a chassis sidewall 52 by the dual wedgelock clamp 10. This position will be determined by the position of the connector socket (not shown) on an underlying motherboard (not shown) with each inner segment 12b and 14b moving outward to contact the sidewalls 54, 56, respectively, of the channel 50 (FIG. 5) as required. If there is not connector establishing the position, the tabs 42 on the circuit board 41 are positioned in the approximate center of the channel 50, determined by the elasticity of the ladder element (FIG. 3).

Figure 6:
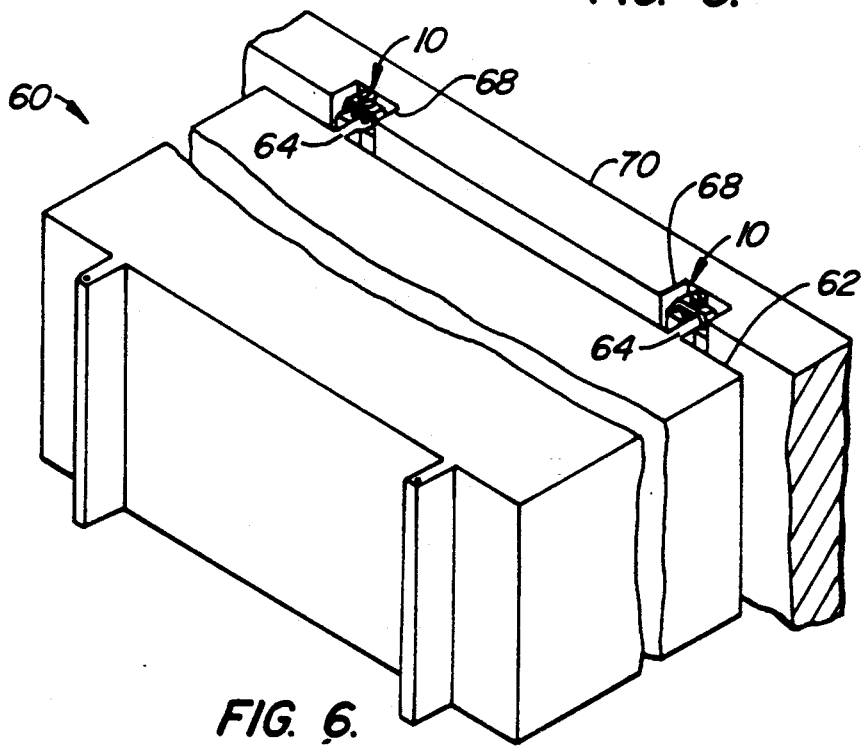

As indicated, FIG. 5 illustrates use of the wedgelock clamp assembly 10 to affix the edge tab 42 of a circuit board 41 to a chassis sidewall 52. As previously described above, circuit assemblies can come in module form, the modules being volumetric, cube configurations, with tabs formed on opposing surfaces for thermal conductivity connection to a chassis. Thus, illustrated in FIG. 6, shown partially, is a module 60 having formed on one side surface 62 thereof tabs 64. It will be appreciated by those skilled in this art that only a side portion of the module 60 is shown. An opposite side surface (not shown) normally would also have tabs (not shown). The module 60 may have an underlying connector that is received by a receptacle in a motherboard (not shown) that would underlie the module 60.

Further, although not specifically shown, it will be understood that the tabs 64 have a length that extend substantially the width of the side surface 62 of the module 60.

The tabs 64 of the module 60 are adapted to be received in slots 68 formed in a sidewall chassis 70. The tabs 64 are configured in much the same manner as tab 42 of circuit board 40 (FIG. 4); that is, cut-outs (not shown) and attachment means (not shown) similar to the attachment means 50.

So configured, the tabs 64 are each supplied with a wedgelock clamp assembly 10 and the combination inserted in the slots 68 of chassis sidewall 70. The activating screw 18 (FIG. 1) is rotated to, as described above, effect wedging engagement between the tabs 64 and the inner side walls of the slot 68. Thereby, the tabs 64 are captured and held to the chassis sidewall 70, establishing thermal conductivity therewith through the wedgelock clamp assemblies 10.

It should be noted that the use of the wedgelock clamp assemblies 10 to affix module 60 to a chassis sidewall 70, as illustrated in FIG. 6, allows the tolerance between placement of the slots 68 relative to any connection apparatus to be looser. The wedgelock clamp assemblies 10 will tend to take up any misalignment.

In conclusion, there has been described a clamping mechanism for sandwiching, clamping and holding tabs of circuit boards, or tabs of circuit board modules, to a chassis that is easily manufactured and used. In its broadest embodiment, the invention comprises plural, aligned segments. Obviously, it will be evident to those skilled in this art that various modifications and construction can be made of the present invention without varying from the scope of its essence. For example, although the discussion of the invention has been in the context of one having three segments to a leg, preferably it would have any odd number of segments, i.e., 3, 5, 7, etc. Further, although the bottom segments were shown as being held vertically immobile by the pin 27 and aperture 46 (formed in circuit board 40), other means for holding the bottom segments immobile could be found such as, for example, pins, rivets.

What is claimed is:

1. A device for retaining a tab, formed to extend from a module or a circuit board, within an elongate slot of a wall member of a chassis structured to hold the module or circuit board, the device comprising:
   at least a pair of first wedge elements, each having a wedge surface adapted to be disposed within said slot;
   elongate wedge means dimensioned to fit within said slot on each side of said tab, each wedge means having a complementary wedge surface at one end for cooperating with a corresponding one of said wedge surface of said first wedge elements;
   a yoke attached to each wedge means at an end opposite said complementary wedge surface for coupling said wedge means together; and
   actuation means disposed on said yoke for moving said complementary wedge surfaces within said slot with respect to said wedge surfaces of said first wedge elements so as to secure said position of said tab within said slot.

2. The device as defined by claim 1 wherein each of said first wedge elements comprises a plurality of wedge segments for receiving said tab therebetween in generally centered position within said slot.

3. The device as defined by claim 1 wherein each wedge means is adapted to engage the interior of said slot such that said tab remains unflexed in its secured position.

4. The device as defined by claim 1 wherein each of said wedge surfaces of each of said first wedge elements and said complementary wedge surfaces comprise angled surfaces disposed in sliding engagement with each other such that movement of said complementary wedge surfaces by said actuation means moves said wedge means outwardly.

5. The device as claimed in claim 1 wherein each wedge means comprises an upper segment and a lower segment, and complementary wedge surfaces disposed between adjacent segments such that said actuation means moves adjacent complementary wedge surfaces alternately outwardly and inwardly.

6. The device as defined by claim 1 further comprising elastomeric means disposed to coupled said first wedge elements to said wedge means.

7. The device as defined in claim 6 wherein each said wedge means and each of said first wedge elements includes a central elongated opening for receiving a portion of said elastomeric means, and wherein said elastomeric means includes crossover means joining portions of said elastomeric means.

8. The device as defined by claim 6, wherein said elastomric means includes means for biasing said wedge means to a minimum width position.

9. The device as defined in claim 1 wherein said actuation means comprises an activating screw.

10. The device as defined by claim 1 wherein said actuation means produces downward movement of said wedge means.

11. A device for retaining a tab, formed to extend from a module or a circuit board, within an elongate slot formed in a wall structure of a chassis, the device comprising:
   at least a pair of first wedge elements each having an angled first wedge surface;
   elongate wedge means comprising a pair of inner segments and a pair of lower segments, each of said inner segments having a first angled complementary wedge surface formed on one end for cooperating with a corresponding one of said first wedge surfaces, a second angled complementary wedge surface formed on the opposite end of said inner segment and a third angled complementary wedge surface formed on an end of each of said lower segments for cooperating with said second angled complementary wedge surface of said inner segment;
   a yoke attached to each upper segment end opposite said wedge surface for coupling said wedge means together;
   an activating screw disposed on said yoke for producing downward movement on said wedge means for effecting movement of said upper and inner segments relative to one another and to said first wedge elements; and
   elastomeric means disposed to couple said inner segments and said lower segments to one another.

12. A lock for fastening a circuit board in position within an elongate slot formed in a wall member of a chassis, the lock comprising:
   first and second clamps dimensioned to be adapted to be received by said slot, said first and second clamps each including at least a pair of spaced apart, elongate segments configured to move in a direction transverse said elongate dimension of each;

a yoke for coupling said first and second clamps together at one end of said clamps; and an activating means coupled to the yoke for imposing a force to cause each of the segments of said first and second clamps to move in opposite directions, transverse said elongate dimension of each elongate segment, to thereby reduce the spaced apart relation of the elongate segments.

13. The lock as defined by claim 12 further comprising a first wedge surface, and wherein each of said first and second clamps includes a cooperating wedge surface for engaging said first wedge surface at an end opposite said yoke, wherein said activating means moves said first and second clamps in a downward direction such that said cooperating wedge surface is in sliding engagement with said first wedge surface in one of an inward and outward direction with respect to said elongate dimension of said elongate segments.

14. The lock as defined by claim 12 wherein each of the first and second clamps comprises an upper segment and a lower segment and elastomeric means disposed to couple said upper segment and said lower segment.

15. A device for retaining a circuit board in a rectangular slot defining a pair of spaced, confronting slot wall surfaces, the device comprising:
   a first pair of wedge elements, each having a wedge surface;
   a second pair of elongate wedge elements, each having a complementary wedge surface at one end for cooperating with a corresponding one of the wedge surface of the first pair of wedge elements;
   yoke means for holding the first and second pair of wedge elements together with the first wedge elements spaced and generally parallel to the second wedge elements; and
   actuation means coupled to the yoke means for moving said complementary wedge surfaces with respect to the wedge surfaces.

16. A device for retaining a circuit board in a rectangular slot, the device comprising:
   a first plurality of elongate elements oriented end-to-end and having confronting and complementary wedge surfaces for cooperating with corresponding confronting wedge surfaces, a second plurality of elongate elements oriented end-to-end and having confronting and complementary wedge surfaces for cooperating with corresponding confronting wedge surfaces, the first and second pluralities of elongate members being spaced to define a circuit board-receiving space therebetween of a first dimension;
   means coupling an end one of the first and the second pluralities of elongate elements to the other; and
   actuation means mounted to the coupling means for moving said complementary wedge surfaces to change the first dimension to a second dimension.

* * * * *